United States Patent
Fon et al.

(10) Patent No.: US 9,281,258 B1
(45) Date of Patent: Mar. 8, 2016

(54) CHIP SCALE PACKAGES AND RELATED METHODS

(71) Applicant: SEMICONDUCTOR COMPONENTS INDUSTRIES, LLC, Phoenix, AZ (US)

(72) Inventors: Bih Wen Fon, Bukit Baru (MY); Soon Wei Wang, Seremban (MY); How Kiat Liew, Ipoh (MY)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 14/528,106

(22) Filed: Oct. 30, 2014

(51) Int. Cl.
*H01L 23/48* (2006.01)
*H01L 23/31* (2006.01)
*H01L 23/495* (2006.01)
*H01L 25/065* (2006.01)
*H01L 23/00* (2006.01)
*H01L 21/78* (2006.01)
*H01L 21/56* (2006.01)
*H01L 25/00* (2006.01)

(52) U.S. Cl.
CPC .......... *H01L 23/3114* (2013.01); *H01L 21/561* (2013.01); *H01L 21/565* (2013.01); *H01L 21/78* (2013.01); *H01L 23/49503* (2013.01); *H01L 23/49517* (2013.01); *H01L 23/49541* (2013.01); *H01L 23/49575* (2013.01); *H01L 24/83* (2013.01); *H01L 24/97* (2013.01); *H01L 25/0655* (2013.01); *H01L 25/50* (2013.01)

(58) Field of Classification Search
CPC ............ H01L 2224/0401; H01L 24/06; H01L 2224/03; H01L 29/7827
See application file for complete search history.

(56) References Cited

U.S. PATENT DOCUMENTS

2009/0321929 A1* 12/2009 Feng et al. .................... 257/738

* cited by examiner

*Primary Examiner* — Roy Potter
(74) *Attorney, Agent, or Firm* — Adam R. Stephenson, LTD.

(57) ABSTRACT

A chip scale package (CSP) includes a die and a first lead mechanically and electrically coupled to a first surface of the die at a first surface of the first lead. The first surface of the first lead forms a first plane. A second lead is mechanically coupled to a second surface of the die at a first surface of the second lead. The first surface of the second lead forms a second plane. A mold compound at least partially encapsulates the die, forming a CSP. The first plane and the second plane are oriented substantially perpendicularly to a third plane formed by a motherboard surface when the CSP is coupled to the motherboard surface. The CSP includes no wirebonds and the first lead and second lead are on opposing surfaces of the CSP. The third plane of the motherboard may be a largest planar surface of the motherboard.

20 Claims, 8 Drawing Sheets

PRIOR ART

CHIP SCALE PACKAGES AND RELATED METHODS

BACKGROUND

1. Technical Field

Aspects of this document relate generally to semiconductor device packaging.

2. Background Art

Semiconductor devices are often encased within (or partly within) a package prior to use. Some packages contain a single die while others contain multiple die. The package often offers some protection to the die, such as from corrosion, impact and other damage, and often also includes electrical leads or other components which connect the electrical contacts of the die with a motherboard either directly or via a socket. The package may also include components configured to dissipate heat from the die into a motherboard or otherwise away from the package.

SUMMARY

Implementations of chip scale packages (CSPs) may include: a die; a first lead mechanically and electrically coupled to a first surface of the die at a first surface of the first lead, the first surface of the first lead forming a first plane; a second lead mechanically coupled to a second surface of the die at a first surface of the second lead, the first surface of the second lead forming a second plane; and a mold compound at least partially encapsulating the die, where the die, first lead, second lead, and mold compound form a chip scale package (CSP); wherein the first plane of the first lead and the second plane of the second lead are oriented substantially perpendicularly to a third plane formed by a motherboard when the CSP is coupled to the motherboard.

A method of forming the aforementioned CSP may include: mechanically and electrically coupling the die to the first lead, the first lead included in a first lead frame, the first lead frame having a plurality of partially etched locations; mechanically and electrically coupling the die to the second lead, the second lead included in a second lead frame and coupled to tie bars of the second lead frame; mechanically and electrically coupling the die to a third lead at the second surface of the die and at a fourth plane formed by a first surface of the third lead, the third lead included in the second lead frame and coupled to the tie bars of the second lead frame; at least partially encapsulating the die and the second lead frame using the mold compound; and singulating the first lead frame, the mold compound and the tie bars of the second lead frame to form a chip scale package (CSP) wherein the fourth plane of the third lead is oriented substantially perpendicularly to the third plane formed by the motherboard when the CSP is coupled to a motherboard.

Implementations of CSPs may include one, all, or any of the following:

The third plane of the motherboard may include a largest planar surface of the motherboard.

The first plane of the first lead may include a largest planar surface of the first lead and the second plane of the second lead may include a largest planar surface of the second lead.

The second surface of the die may be on a side of the die opposite the first surface of the die.

The die may be a first die, and the CSP may further include a second die mechanically and electrically coupled to the first surface of the second lead at a first surface of the second die, the second die mechanically and electrically coupled to the first die at a second surface of the second die and at the second surface of the first die, and the first die may be electrically coupled to the second lead only through the second die.

The first lead and the second lead may be on opposing surfaces of the CSP.

The CSP may include no wirebonds.

Implementations of CSPs may include: a die; a first lead mechanically and electrically coupled to a first surface of the die at a first surface of the first lead, the first lead having a second surface on an opposite side of the first lead from the first surface of the first lead, the first lead having a thickness between the first surface of the first lead and the second surface of the first lead; a second lead mechanically and electrically coupled to a second surface of the die at a first surface of the second lead, the second lead having a second surface on an opposite side of the second lead from the first surface of the second lead, the second lead having a thickness between the first surface of the second lead and the second surface of the second lead; and a mold compound at least partially encapsulating the die, where the die, first lead, second lead, and mold compound form a chip scale package (CSP); wherein the thickness of the first lead and the thickness of the second lead are configured to be coupled to the motherboard when the CSP is coupled to the motherboard.

Implementations of CSPs may include one, all, or any of the following:

The thickness of the first lead and the thickness of the second lead may be substantially parallel with a largest planar surface of the motherboard.

The CSP may have no wirebonds.

Implementations of methods of forming a CSP may include: mechanically and electrically coupling a plurality of die to a plurality of first leads of a first lead frame at a first surface of each first lead and at a first surface of each die, the first surface of each first lead forming a first plane and the first lead frame having a base; mechanically and electrically coupling the plurality of die to a plurality of second leads of a second lead frame at a first surface of each second lead and at a second surface of each die, the first surface of each second lead forming a second plane and the second lead frame having a base, wherein the second surface of the die is on an opposite side of the die from the first surface of the die; at least partially encapsulating each die with a mold compound; removing the base of the first lead frame and the base of the second lead frame, forming a plurality of CSPs; and singulating the plurality of CSPs, wherein each CSP is configured so that the first plane of each first lead and the second plane of each second lead are substantially perpendicular to a third plane formed by a motherboard when the CSP is coupled to the motherboard.

Implementations of methods of forming a CSP may include one, all, or any of the following:

The third plane of the motherboard may include a largest planar surface of the motherboard.

Each die may be a first die, and the method may further include mechanically and electrically coupling a plurality of second die to the plurality of second leads, wherein each second die is mechanically and electrically coupled to one of the second leads at a first surface of the second die and at the first surface of the second lead, the method further including mechanically and electrically coupling each second die to one of the first die at a second surface of the second die and at a second surface of the first die, and wherein each first die is electrically coupled to one of the second leads only through one of the second die.

Mechanically and electrically coupling the plurality of die to a plurality of third leads coupled to the base of the second lead frame, wherein each die is mechanically and electrically coupled to one of the third leads at the second surface of the die and at a fourth plane formed by a first surface of the third lead, the method further including orienting the fourth plane of each third lead substantially perpendicularly to the third plane of the motherboard when the CSP is coupled to the motherboard.

The CSP may include no wirebonds.

Implementations of a method of forming a CSP may include: mechanically and electrically coupling a plurality of die to a plurality of first leads of a first lead frame, the first lead frame having a plurality of partially etched locations, each die being coupled to one of the first leads at a first surface of the die and at a first surface of the first lead, the first surface of each first lead forming a first plane; mechanically and electrically coupling the plurality of die to a plurality of second leads of a second lead frame, the second lead frame including a plurality of partially etched locations, each die being coupled to one of the second leads at a second surface of the die and at a first surface of the second lead, the first surface of each second lead forming a second plane, wherein the second surface of each die is on an opposite side of the die from the first surface of the die; at least partially encapsulating each die with a mold compound; and singulating the first lead frame, the mold compound and the second lead frame to form a plurality of chip scale packages (CSPs); wherein the first plane of each first lead and the second plane of each second lead are oriented substantially perpendicularly to a third plane formed by a motherboard when the CSP is coupled to the motherboard.

Implementations of methods of forming a CSP may include one, all, or any of the following:

The third plane of the motherboard may include a largest planar surface of the motherboard.

Each die may be a first die, and the method may further include mechanically and electrically coupling a plurality of second die to the plurality of second leads at a first surface of each second die and at a first surface of each second lead, wherein each second die is mechanically and electrically coupled to one of the first die at a second surface of the first die and a second surface of the second die, and wherein each first die is electrically coupled to one of the second leads only through one of the second die.

The CSP may include no wirebonds.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended chip scale packages and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such chip scale packages and related methods, and implementing components and methods, consistent with the intended operation and methods.

This document references chip-scale packages (CSPs). In the past, conventional CSPs have been classified as including only packages that have an area no greater than 1.2 times that of the die. As some die sizes decreased (die shrink), due to improvements in die manufacturing technologies, while their respective package sizes remained the same, the definition of CSPs has changed to accommodate packages that have a package/die ratio greater than 1.2. As used herein, "chip-scale package" (CSP) is a near die size package with a ball pitch (where applicable) of 1 mm or less.

Figure 1:
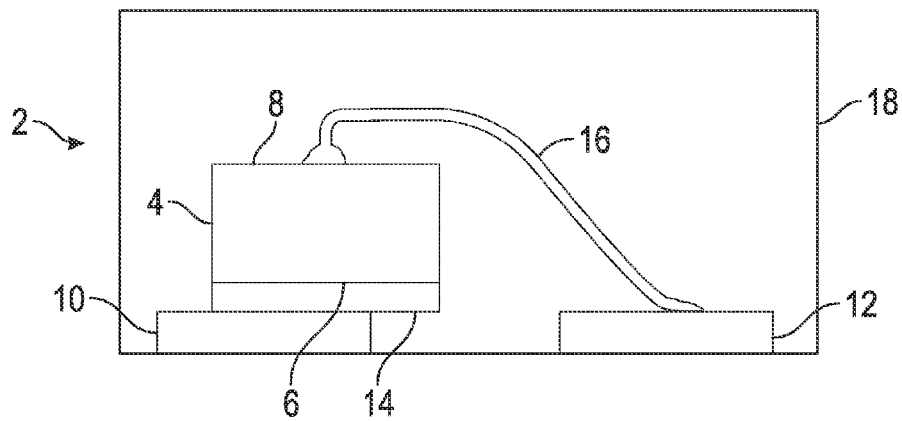
FIG. 1 is side view of a conventional single-die chip scale package (CSP) with the mold (encapsulation) compound drawn in see-through fashion so as to more easily depict the other elements.
Figure 2:
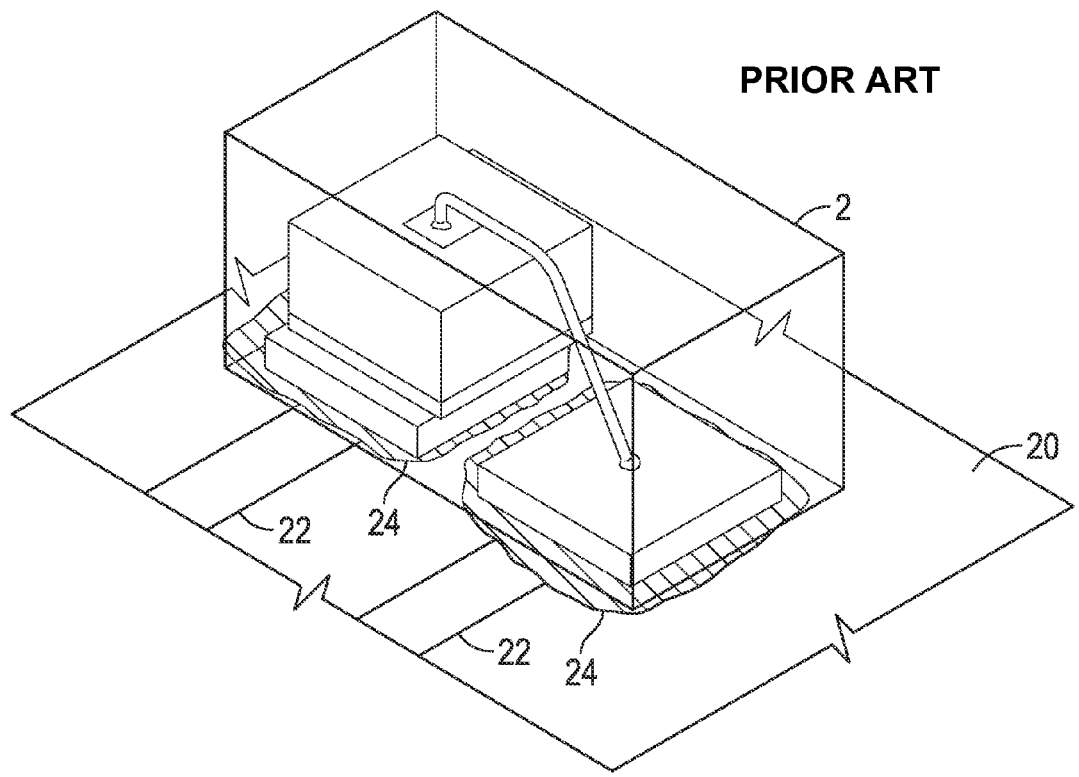
FIG. 2 is a top perspective view of the CSP of FIG. 1 on a motherboard with the mold compound drawn in see-through fashion.

Referring now to FIGS. 1-2, in various implementations, a conventional single-die CSP 2 includes a die 4 having at least one electrical contact on a first surface 6 mechanically and electrically coupled to a first lead 10 using a conductive adhesive 14. A wirebond 16 is coupled to a second surface 8 on an opposite side of the die 4 from the first surface 6 and couples at least one electrical contact on the second surface 8 with a second lead 12. A mold compound 18 encapsulates the die 4, wirebond 16, and conductive adhesive 14 and at least partially encapsulates the first and second leads 10, 12, while leaving portions of those leads exposed so that the CSP 2 may be electrically coupled thereby to conductive paths 22 of a motherboard 20, such as by using a solder 24, as shown in FIG. 2. In FIGS. 1 and 2, the mold (encapsulating) compound is shown in see through to enable a view of the internal structure of the package.

Figure 3:
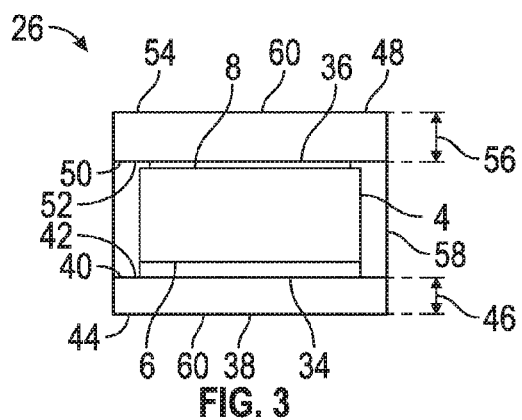
FIG. 3 is a side view of a single-die CSP with the mold compound drawn in see-through fashion.
Figure 4:
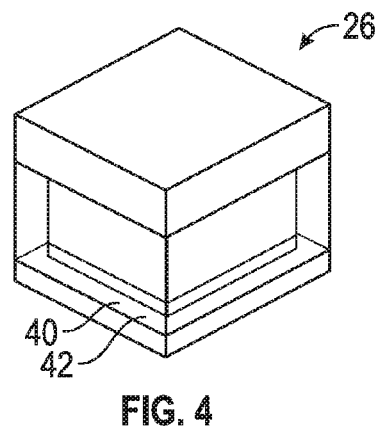
FIG. 4 is a top perspective view of the CSP of FIG. 3 with the mold compound drawn in see-through fashion.
Figure 5:
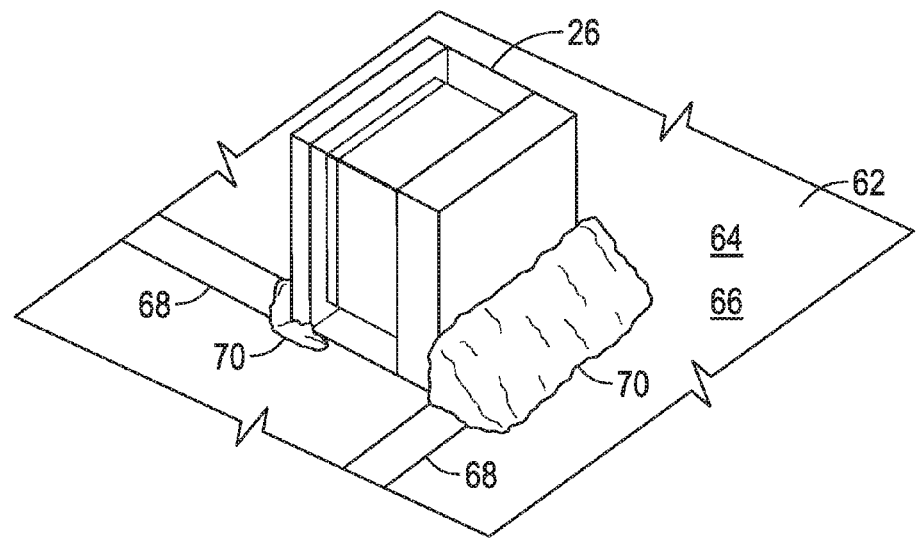
FIG. 5 is a top perspective view of the CSP of FIG. 3 on a motherboard with the mold compound drawn in see-through fashion.

Referring now to FIGS. 3-5, implementations of a CSP 26 include a die 4 having at least one electrical contact on its first surface 6 mechanically and electrically coupled to a first surface 40 of a first lead 38 with a conductive adhesive 34 and at least one electrical contact on its second surface 8 mechanically and electrically coupled to a first surface 50 of a second lead 48 using a conductive adhesive 36. The first surface 40 of the first lead 38 forms a first plane 42 which, in the implementations shown, is the largest planar surface of the first lead 38 (though in other implementations it may not be the largest planar surface). The first surface 50 of the second lead 48 forms a second plane 52 which, in the implementations shown, is the largest planar surface of the second lead 48 (though in some implementations, may similarly not be the largest planar surface). The first lead 38 has a thickness 46 between the first surface 40 and a second surface 44 on a side of the first lead 38 opposite the first surface 40. The second lead 48 has a thickness 56 between the first surface 50 and a second surface 54 on a side of the second lead 48 opposite the first surface 50. A mold compound 58 encapsulates the die 4 and the conductive adhesives 34, 36, and covers the first surface 40 of the first lead 38 and first surface 50 of the second lead 48, forming the CSP 26. The first lead 38 and second lead 48 are located on opposing surfaces 60 of the CSP 26.

When mounting the CSP 26 on a motherboard 62 the CSP 26 is tilted (rotated) onto its side so that the thicknesses 46, 56 of the first lead 38 and second lead 48 contact the motherboard 62 or are otherwise substantially parallel with a third plane 64 formed by the motherboard 62 (which, in the implementations shown, is the largest planar surface 66 of the motherboard 62). The leads 38, 48 are electrically coupled to the conductive paths 68 included in the motherboard 62 by various conventional materials, such as by using solder 70. As can be seen in FIG. 5, the solder 70 may be coupled to the thicknesses 46, 56 and/or to the second surfaces 44, 54 of the leads 38, 48. The thicknesses 46, 56 are parallel, or substantially parallel, with the third plane 64.

As can be seen by comparing FIG. 2 with FIGS. 3-5, coupling the first surface 50 of the second lead 48 with the die 4 using a conductive adhesive 36 allows the CSP 26 to be formed without using any wirebonds (such as wirebond 16) and results in an overall reduction in size of the CSP 26 as compared to CSP 2. In implementations the CSP 2 shown in FIG. 1 has dimensions of, or of about, 0.620 mm by 0.320 mm by a height of 0.297 mm, while the CSP 26 shown in FIG. 3 has dimensions of, or of about, 0.230 mm by 0.230 mm by a height of 0.300 mm (in other words, the footprint of CSP 26 is less than half the footprint of CSP 2).

Figure 6:
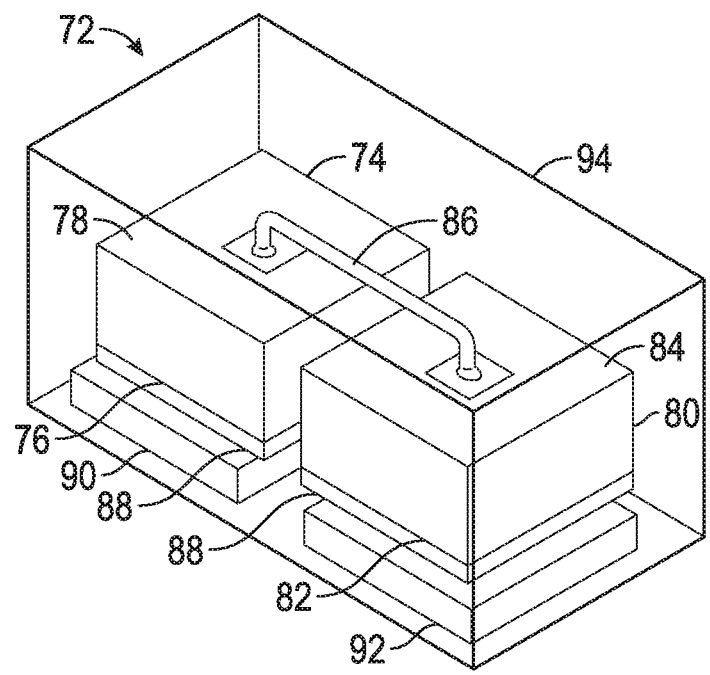
FIG. 6 is a top perspective view of a conventional dual-die CSP with the mold compound drawn in see-through fashion.

Referring now to FIG. 6, an implementation of a conventional dual die CSP 72 including a first die 74 and a second die 80 is illustrated. At least one electrical contact on a first surface 76 of the first die 74 is mechanically and electrically coupled to a first lead 90 using a conductive adhesive 88 and at least one electrical contact on a first surface 82 of the second die 80 is mechanically and electrically coupled to a second lead 92 using a conductive adhesive 88. A wirebond 86 couples at least one electrical contact on a second surface 78 of the first die 74 (which opposes the first surface 76 of the first die 74) with at least one electrical contact on a second surface 84 of the second die 80 (which opposes the first surface 82 of the second die 80). A mold compound 94 encapsulates the first die 74, second die 80, conductive adhesive 88, wirebond 86, and partially encapsulates the first lead 90 and second lead 92 while leaving a bottom surface of the first lead 90 and a bottom surface of the second lead 92 exposed to be coupled to a motherboard. The mold compound 94 has been illustrated in see-through to show the internal structure of the package.

Figure 7:
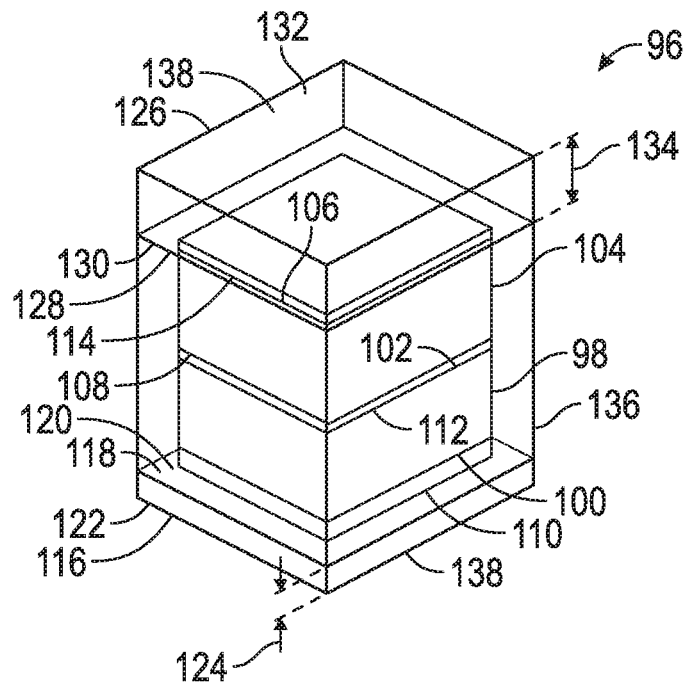
FIG. 7 is a top perspective view of a dual-die CSP with the mold compound and second lead drawn in see-through fashion.

Referring now to FIG. 7, an implementation of a CSP 96 having a dual die configuration is illustrated that includes a first die 98 having a first surface 100 and a second surface 102 on an opposing side of the first die 98 from the first surface 100. A second die 104 includes a first surface 106 and a second surface 108 on an opposing side of the second die 104 from the first surface 106. The first die 98 may be the equivalent of first die 74 and the second die 104 may be the equivalent of second die 80 in various implementations.

A conductive adhesive 112 mechanically and electrically couples at least one electrical contact on the second surface 102 of the first die 98 with at least one electrical contact on the second surface 108 of the second die 104. The conductive adhesive 112 further mechanically couples the first die 98 to the second die 104. A conductive adhesive 110 mechanically and electrically couples at least one electrical contact on the first surface 100 of the first die 98 with a first surface 118 of a first lead 116. The first surface 118 of the first lead 116 forms a first plane 120, which in the implementations shown is the largest planar surface of the first lead 116 (though could not be in some implementations). A conductive adhesive 114 mechanically and electrically couples at least one electrical contact on the first surface 106 of the second die 104 with a first surface 128 of a second lead 126. The first surface 128 of the second lead 126 forms a second plane 130 which, in the implementations shown, is the largest planar surface of the second lead 126 (though could not be in some implementations).

A mold compound 136 encapsulates the first die 98, second die 104, conductive adhesives 110, 112, and 114, the first surface 118 and the first surface 128, forming the CSP 96 (shown see-through). A second surface 122 of the first lead 116, which is on an opposite side of the first lead 116 from the first surface 118, is exposed, and the first lead 116 has a thickness 124 between the first surface 118 and second surface 122. A second surface 132 of the second lead 126, which is on an opposite side of the second lead 126 from the first surface 128, is exposed, and the second lead 126 has a thickness 134 between the first surface 128 and second surface 132. The first lead 116 and second lead 126 are located on opposing surfaces 138 of the CSP 96. The first die 98 is electrically coupled to the second lead 126 only through the second die 104.

Figure 8:
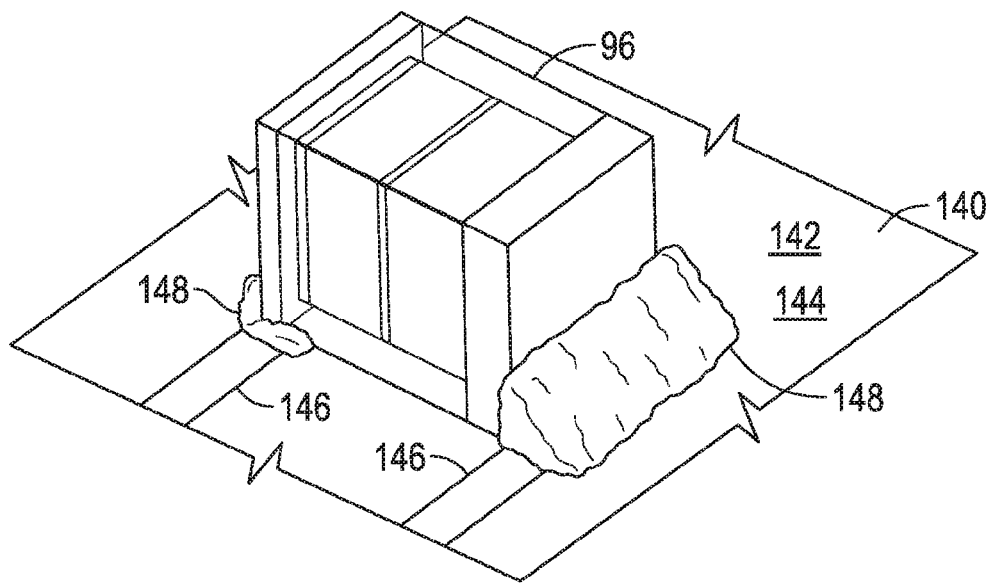
FIG. 8 is a top perspective view of the CSP of FIG. 7 on a motherboard with the mold compound drawn in see-through fashion.

Referring now to FIG. 8, the CSP 96 is turned on its side, or in other words is rotated about ninety degrees from its upright configuration shown in FIG. 7, to couple the CSP 96 to a motherboard 140. The motherboard 140 forms a third plane 142 which, in the implementations shown, is the largest planar surface 144 of the motherboard 140. Solder 148 is used to couple the first lead 116 and second lead 126 with conductive paths 146 of the motherboard 140. In the implementations shown the CSP 96 is oriented such that, when mounted to the motherboard 140, the first plane 120 and second plane 130 are perpendicular to, or substantially perpendicular to, the third plane 142 of the motherboard 140. As can be seen from FIG. 8 the solder 148 may be coupled to the thicknesses 124, 134 of the leads 116, 126 and/or to the second surfaces 122, 132 of the leads 116, 126. The thicknesses 124, 134 are parallel, or substantially parallel, with the third plane 142 when the CSP 96 is mounted to the motherboard 140.

As can be realized from comparing the package illustrated in FIG. 6 to the package illustrated in FIGS. 7-8, stacking the die 98, 104 atop one another in CSP 96 allows CSP 96 to not have any wirebonds (such as wirebond 86) and further reduces the overall package size of CSP 96 as compared with CSP 72. In implementations the CSP 72 shown in FIG. 6 may have dimensions of, or of about, 0.620 mm by 0.320 mm by a height of 0.297 mm, while the CSP 96 shown in FIG. 7 has dimensions of, or of about, 0.230 mm by 0.230 mm by a height of 0.450 mm.

Figure 9:
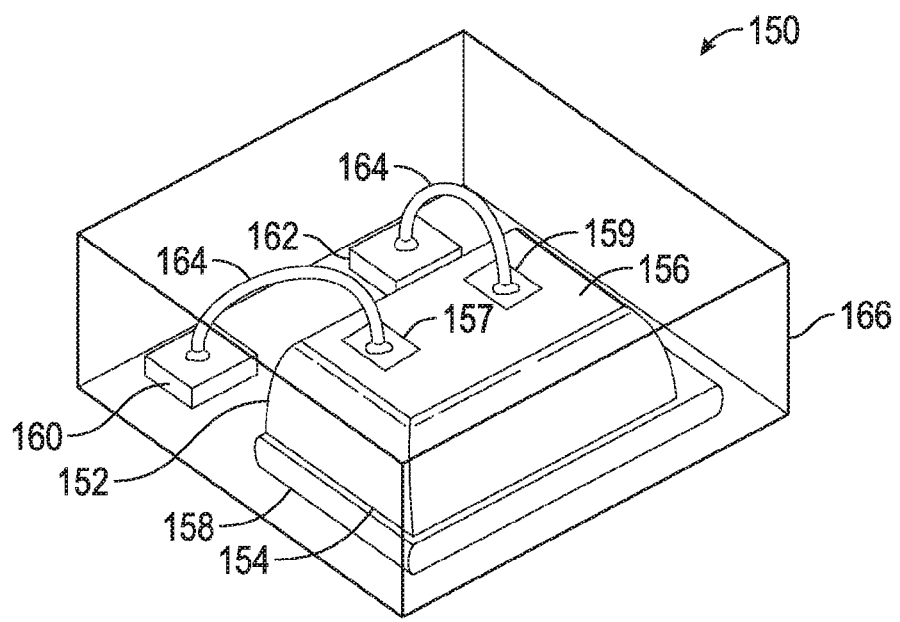
FIG. 9 is a top perspective view of a conventional metal-oxide-semiconductor field-effect-transistor (MOSFET) CSP with the mold compound drawn in see-through fashion.

Referring now to FIG. 9, in various implementations a conventional metal-oxide-semiconductor field-effect-transistor (MOSFET) CSP 150 includes a die 152 having a first surface 154 and a second surface 156 on an opposite side of the die 152 from the first surface 154. The first surface 154 is coupled to a first lead 158. A first wirebond 164 couples an electrical contact 157 on the second surface 156 of the die 152 with a second lead 160 and a second wirebond 164 couples another electrical contact 159 on the second surface 156 of the die 152 with a third lead 162. At least one electrical contact on the first surface 154 of the die 152 is mechanically and electrically coupled to the first lead 158 using a conductive adhesive. A mold compound 166 encapsulates the die 152, wirebonds 164, conductive adhesive, and at least a portion of the first lead 158, second lead 160 and third lead 162, with the bottom surfaces of each of the leads 158, 160, and 162 being exposed on a bottom surface of the CSP 150. The first, second, and third leads 158, 160, 162 correspond to the respective source, drain, and gate regions of the MOSFET device.

Figure 10:
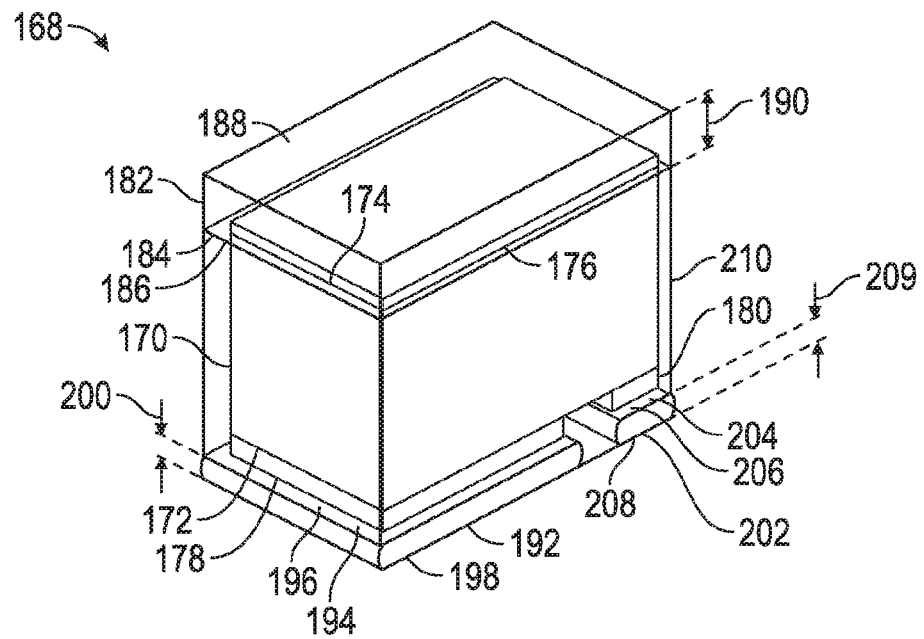
FIG. 10 is a top perspective view of a MOSFET CSP with the mold compound and first lead are drawn in see-through fashion.
Figure 11:
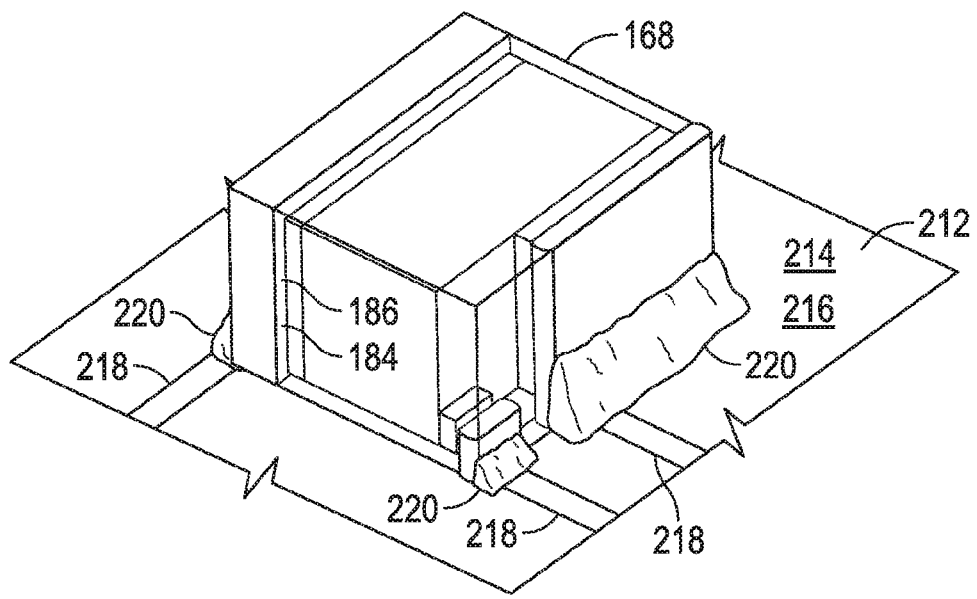
FIG. 11 is a top perspective view of the MOSFET CSP of FIG. 10 on a motherboard with the mold compound drawn in see-through fashion.

Referring now to FIGS. 10-11, an implementation of a MOSFET CSP 168 includes a die 170 having a first surface 172 and a second surface 174 on an opposite side of the die 170 from the first surface 172. A conductive adhesive 176 mechanically and electrically couples at least one electrical contact on the second surface 174 with a first surface 184 of a first lead 182. The first surface 184 forms a first plane 186 which, in the implementations shown, is the largest planar surface of the first lead 182. The first lead 182 has a second surface 188 on an opposite side of the first lead 182 from the first surface 184, and further includes a thickness 190 between the first surface 184 and second surface 188. A conductive adhesive 178 electrically and mechanically couples at least one electrical contact on the first surface 172 of the die 170 with a first surface 194 of a second lead 192. The first surface 194 of the second lead 192 forms a second plane 196 which, in the implementations shown, is the largest planar surface of the second lead 192. The second lead 192 has a second surface 198 on an opposite side of the second lead 192 from the first surface 194 and a thickness 200 between the first surface 194 and second surface 198. Also, a conductive adhesive 180 electrically and mechanically couples an electrical contact on the first surface 172 of the die 170 with a first surface 204 of a third lead 202. The first surface 204 of the third lead 202 forms a fourth plane 206. The third lead 202 includes a second surface 208 on an opposite side of the third lead 202 from the first surface 204 and a thickness 209 between the first surface 204 and second surface 208.

A mold compound 210 encapsulates the die 170, conductive adhesives 176, 178, and 180, and a portion of the leads 182, 192, 202, forming the CSP 168 (shown in see-through). The second surface 188 and thickness 190 of the first lead 182, second surface 198 and a portion of the thickness 200 of the second lead 192, and second surface 208 and a portion of the thickness 209 of the third lead 202 are exposed for electrically coupling the CSP 168 to a motherboard 212.

When mounting the CSP 168 to a motherboard 212 the CSP 168 is turned on its side or, in other words, about ninety degrees from its upright position shown in FIG. 10, so that the thicknesses 190, 200, 209 are contacting the motherboard 212 (or conductive paths 218 of the motherboard 212) or are otherwise parallel with, or are substantially parallel with, a third plane 214 formed by the motherboard 212. In the implementations shown the third plane 214 is the largest planar surface 216 of the motherboard 212. Solder 220 mechanically and electrically couples the leads 182, 192, 202 to the conductive paths 218 of the motherboard 212.

As can be seen in FIG. 11, when the CSP 168 is mounted on the motherboard 212 the first plane 186, second plane 196 and fourth plane 206 are perpendicular to, or are substantially perpendicular to, the third plane 214 of the motherboard 212.

As can be realized from comparing FIG. 9 to FIGS. 10-11, coupling the leads 182, 192, 202 directly to the die 170 with conductive adhesives 176, 178, 180 allows CSP 168 to not have any wirebonds (such as wirebonds 164) and further reduces the overall package size of CSP 168 as compared with CSP 150. In implementations the CSP 150 shown in FIG. 9 may have dimensions of, or of about, 0.620 mm by 0.620 mm by a height of 0.400 mm, while the CSP 168 shown in FIGS. 10-11 has dimensions of, or of about, 0.320 mm by 0.550 mm by a height of 0.320 mm.

Figure 12:
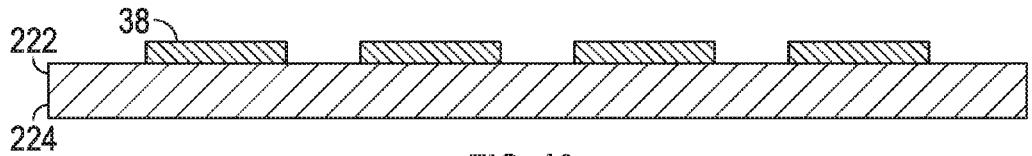
FIG. 12 is a side cross-section view of a first leadframe used in a method of forming a CSP.
Figure 13:
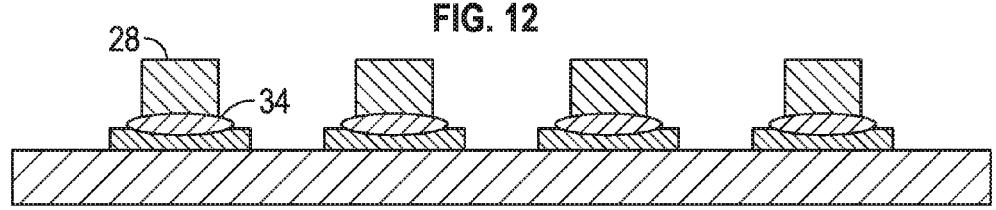
FIG. 13 is a side cross-section view of a plurality of die coupled to the first leadframe of FIG. 12.
Figure 14:
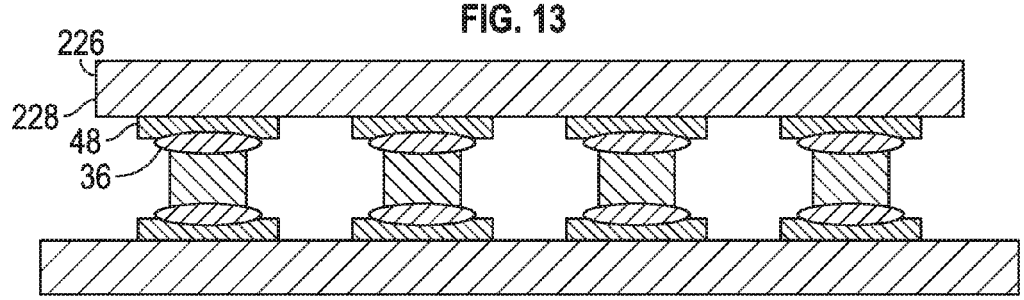
FIG. 14 is a side cross-section view of a second leadframe coupled to the plurality of die of FIG. 13.
Figure 24:
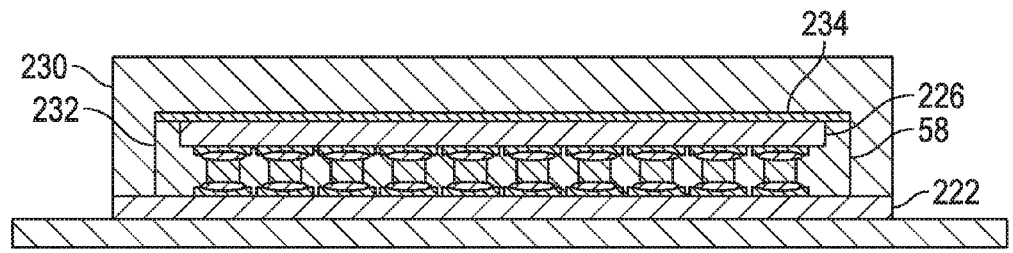
FIG. 24 is a side cross-section view of a mold and various elements used in a method of forming a CSP.

Referring now to FIGS. 12-17, a process for forming a plurality of CSPs 26 is shown, though variations of this same process may be utilized to form a plurality of CSPs 96 and/or a plurality of CSPs 168. Referring now to FIG. 12, a first lead frame 222 is provided which includes a base 224 and, attached (coupled) thereto, are a plurality of first leads 38. A second surface 44 of each first lead 38 (see FIG. 3) is attached to the base 224 and a first surface 40 of each first lead 38 is exposed. The first leads 38 may have been preplated onto the base 224 using any of a wide variety of electroplating methods and systems. Conductive adhesive 34 is used to mechanically and electrically couple at least one electrical contact on a first surface 6 of each die 4 with a first surface 40 of one of the first leads 38, as shown in FIGS. 13 and 3. Referring to FIG. 14 a second lead frame 226 having a base 228 and a plurality of second leads 48 thereon, similar to the first lead frame 222, is provided, and conductive adhesive 36 is used to mechanically and electrically couple at least one electrical contact on a second surface 8 of each die 4 with a first surface 50 of one of the second leads 48, the second surface 54 of each of the second leads 48 being attached to the base 228. The elements shown in FIG. 14 are placed within a mold 230, shown in FIG. 24, having a mold cavity 232. An upper member 234 is provided within the mold 230 which in the implementation shown includes a silicon rubber, though in implementations this may be omitted. The silicon rubber may serve as a releasing agent. The mold cavity 232 is filled with the mold compound 58, forming a plurality of CSPs 26 in a single panel.

Figure 15:
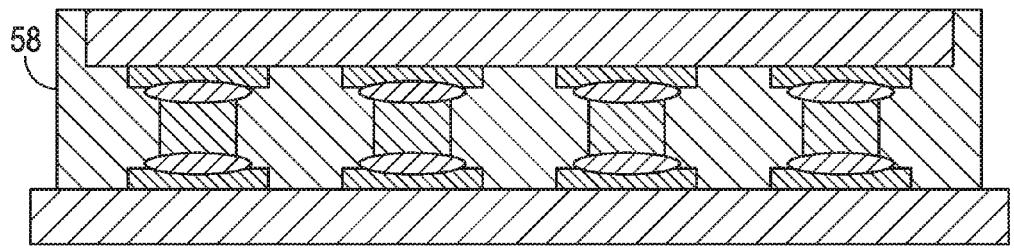
FIG. 15 is a side cross-section view of a mold compound encapsulating the plurality of die of FIG. 14.
Figure 16:
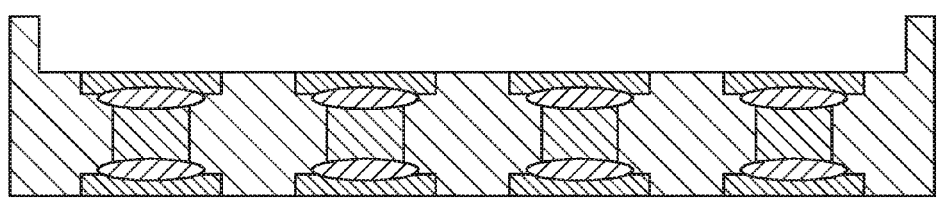
FIG. 16 is a side cross-section view of the elements of FIG. 15 with base members of the first leadframe and second leadframe removed.
Figure 17:
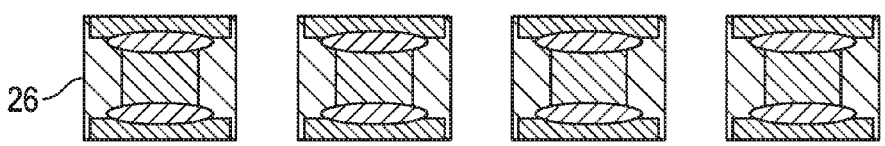
FIG. 17 is a side cross-section view of a plurality of singulated CSPs formed by singulating the elements of FIG. 16.

The panel is then removed from the mold 230, as shown in FIG. 15. The base 224 of the first lead frame 222 and base 228 of the second lead frame 226 are then removed such as, by non-limiting example, with a chemical etching process, exposing the second surfaces 44, 54 of the leads 38, 48, as shown in FIG. 16, and the CSPs 26 are singulated as shown in FIG. 17 such as, by non-limiting example, through the use of saw or punch singulation. In particular implementations, the base 224 and base 228 may be made out of copper.

As indicated above, a similar procedure may be utilized to form a plurality of CSPs 96 with two or more die therein, the difference being that, in the case of two die, an additional step would be added to couple the second surface 108 of the second die 104 to the second surface 102 of the first die 98—the remaining steps would be identical or very similar—for instance the first surface 128 of each second lead 126 would be adhered to the first surface 106 of the second die 104, instead of to the first die 98, and so forth. As also indicated above, a similar procedure may be utilized to form CSP 168, the difference being that an additional lead would be required on one side of the die 170. For example, the second lead frame 226 could have two leads configured to be coupled to each die 170. Thus the first lead frame 222 would include the first leads 182 and the second lead frame 226 would include the second leads 192 and third leads 202 for each die 170. In such a method each die 170 would be mechanically and electrically coupled to one of the third leads 202 at the first surface 172 of the die 170 and at a fourth plane 206 formed by a first surface 204 of the third lead 202. The remainder of the process would be identical or very similar to that previously described in this document.

Figure 18:
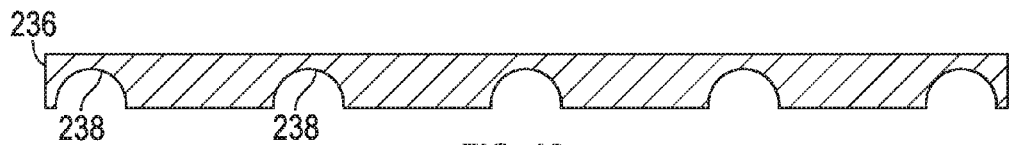
FIG. 18 is a side cross-section view of a first leadframe used in a method of forming a CSP.
Figure 19:
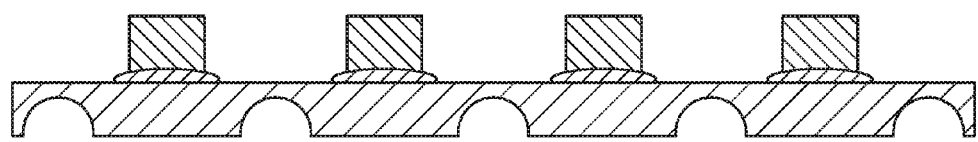
FIG. 19 is a side cross-section view of a plurality of die coupled to the first leadframe of FIG. 18.
Figure 20:
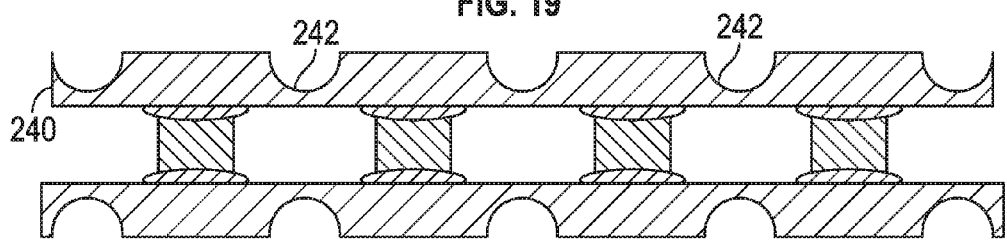
FIG. 20 is a side cross-section view of a second leadframe coupled to the plurality of die of FIG. 19.

Referring now to FIGS. 18-23 (with reference to FIG. 3), another process is shown for forming a plurality of CSPs 26. This process may also be used for forming a plurality of CSPs 96. Referring now to FIG. 18, a first lead frame 236 is provided which includes a plurality of partially etched locations 238. In some implementations, the partially etched lead frame may be referred to as "half etched." A first surface 6 of each die 4 is coupled to the first lead frame 236 in between two partially etched locations 238 using a conductive adhesive 34, as shown in FIG. 19, at locations that will effectively become the first surfaces 40 of the first leads 38, the first surface 40 of each first lead 38 forming a first plane 42. A second lead frame 240 is then coupled to the second surface 8 of each die 4 using a conductive adhesive 36, as shown in FIG. 20. The second lead frame 240 includes a plurality of partially etched locations 242 that in the implementation shown are aligned with the partially etched locations 238. Each die 4 is coupled to one of the second leads 48 at a second surface 8 of the die 4 and at a first surface 50 of the second lead 48, the first surface 50 of each second lead 48 forming a second plane 52.

Figure 25:
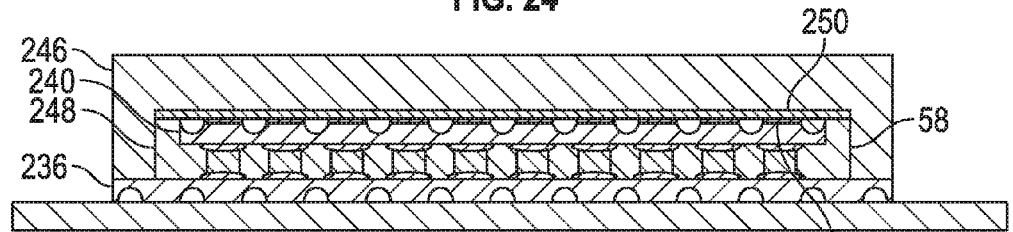
FIG. 25 is a side cross-section view of a mold and various elements used in another method of forming a CSP.

The assembly is placed within a mold 246 having a mold cavity 248, as shown in FIG. 25, the mold 246 also having an upper member 250 which, in the implementations shown, is a silicon rubber. The mold cavity 248 is then filled with mold compound 58, forming a plurality of CSPs 26 in a single panel. The upper member 250 in implementations may prevent the mold compound 58 from filling the partially etched locations 242.

Figure 21:
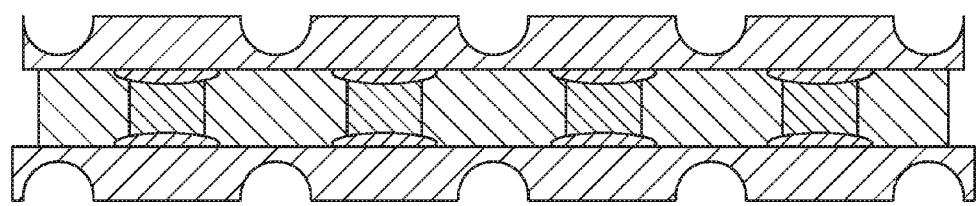
FIG. 21 is a side cross-section view of a mold compound encapsulating the plurality of die of FIG. 20.
Figure 22:
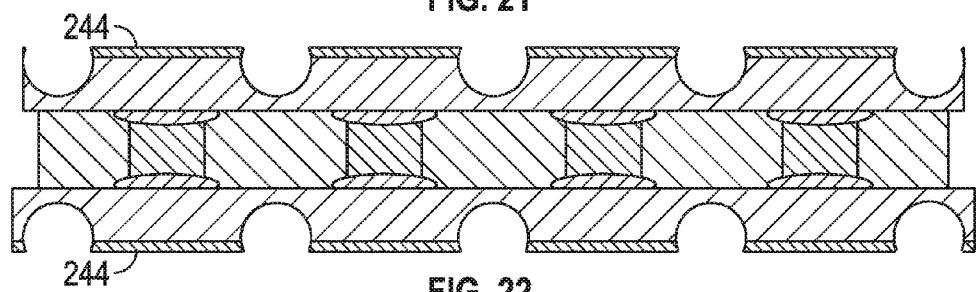
FIG. 22 is a side cross-section view of plating coupled to leads of the first leadframe and plating coupled to leads of the second leadframe of FIG. 21.
Figure 23:
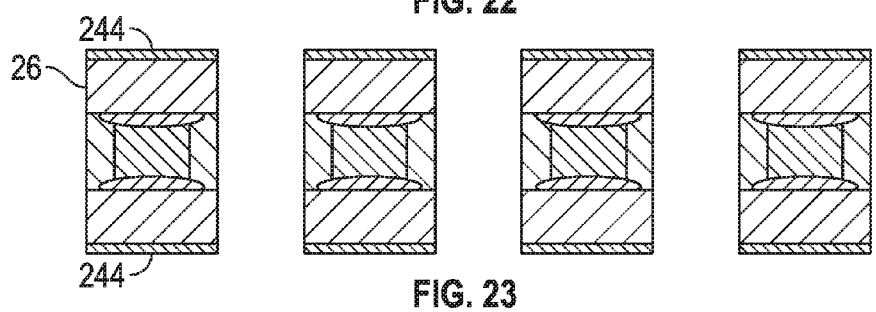
FIG. 23 is a side cross-section view of a plurality of singulated CSPs formed by singulating the elements of FIG. 22.

The panel may then be removed from the mold 246, as shown in FIG. 21. Plating 244 may be applied to portions of the first and second lead frames 236, 240 (though this may also have been done earlier or later in the process, such as using pre-plated frame or applying plating after package singulation), and the individual CSPs 26 may be singulated as shown in FIG. 23, such as, by non-limiting example, through the use of saw or punch singulation at locations corresponding with the partially etched locations 238, 242. Accordingly, in this method implementation, it is portions of the lead frames 236, 240 themselves, between the partially etched locations 238 and 242, respectively, which form the leads 38, 48 of CSP 26 once the panel is singulated.

As indicated above, a similar procedure may be utilized to form a plurality of CSPs 96 (containing two or more die), the difference being that an additional step would be added to couple the second die 104 to the first die 98. In such an implementation a plurality of second die 104 would be mechanically and electrically coupled to the plurality of second leads 126 at a first surface 106 of each second die 104 and at a first surface 128 of each second lead 126. Each second die 104 would be mechanically and electrically coupled to one of the first die 98 at a second surface 102 of the first die 98 and a second surface 108 of the second die 104, and each first die 98 would be electrically coupled to one of the second leads 126 only through one of the second die 104. The remaining steps would be identical or very similar to those disclosed in this document.

Figure 26:
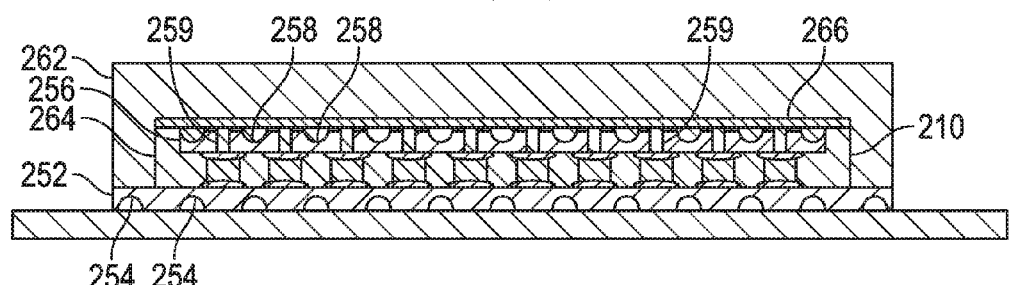
FIG. 26 is a side cross-section view of a mold and various elements used in another method of forming a CSP.
Figure 27:
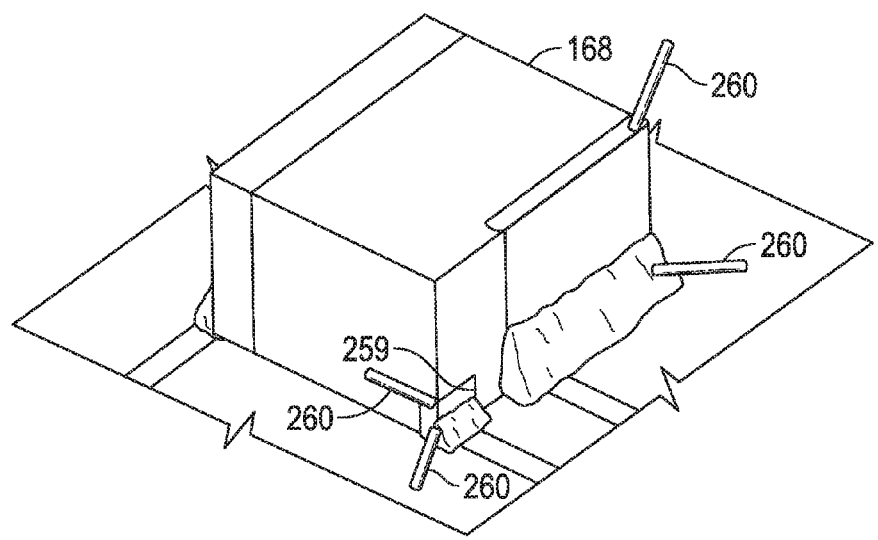
FIG. 27 is a top perspective view of the MOSFET CSP of FIG. 11 shown with tie bars used in a method of forming the MOSFET CSP—the tie bars are removed during singulation and so are not actually present when the MOSFET CSP is placed on a motherboard but are shown together with the motherboard for perspective.

Referring to FIGS. 26-27, in various implementations of a method of forming a semiconductor package, a process modified from that process shown in FIGS. 18-23 and 25 may be utilized to form a plurality of CSPs 168. In this process, referring to FIG. 26, the first lead frame 252 has a plurality of partially etched locations 254 and may be basically identical or very similar to first lead frame 236. The die 170 are coupled to the first lead frame 252 using a conductive adhesive 176. The second lead frame 256 includes a plurality of partially etched locations 258 but differs from second lead frame 240 in that second lead frame 256 also includes a plurality of gaps 259 (also seen in FIG. 27). The gaps 259 separate the second leads 192 from the third leads 202.

The reader may realize, upon viewing FIG. 26, that this cross-section view does not show how the second lead frame 256 can be held together prior to being adhered to the plurality of die 170 since the gaps 259 are present. In implementations the second lead frame 256 has tie bars 260 which couple the portions of the second lead frame 256 together within the gaps 259. Representative examples of tie bars 260 are shown in FIG. 27 for the purposes of illustration to show the relationship of the bars to the second leads and third leads, since it is difficult to show them in the view of FIG. 26, though in reality the tie bars 260 will be removed during a singulation process and are not be present when the CSP 168 is mounted to a motherboard. The tie bars 260 couple the various portions of the second lead frame 256 together, for example along a direction that goes through the page (or out of the page) in FIG. 26. In some implementations the second lead frame 256 may include only tie bars 260 and no partially etched locations 258, the partially etched locations 258 being replaced by tie bars 260 and the second leads 192 and third leads 202 being held together just by a network of tie bars 260.

As with the other processes, once the second lead frame 256 has been adhered to the plurality of die 170 using conductive adhesives 178, 180, the assembly may be placed within a mold 262 having a mold cavity 264. The mold 262 may also have an upper member 266 which, in the implementations shown, may be a silicon rubber. The mold cavity 264 may be filled with mold compound 210, forming a plurality of CSPs 168 in a single panel. The mold compound 210 may fill the gaps 259 and, in implementations the partially etched locations 258 (though in implementations the upper member 266 may prevent the mold compound 210 from filling the partially etched locations 258). The molded panel may then be removed from the mold 262 and singulated, such as by non-limiting example through punch or saw singulation, to form a plurality of individual CSPs 168, by singulating at locations corresponding with the partially etched locations 254, 258. Accordingly, in this process it is actually portions of the lead frames 252, 256 themselves, between the partially etched locations 254 and 258, respectively, which form the leads 182, 192, 202 of the CSP 168 once the panel is singulated.

One of the basic and novel characteristics of implementations of CSPs 26, 96, 168 is the exclusion of any wirebonds, which allows for a reduced size of the CSPs and, corresponding, fewer failure mechanisms. Another of the basic and novel characteristics of implementations of CSPs 26, 96, 168 is mounting of the CSP to a motherboard at a ninety degree rotation from a conventional mounting configuration, which allows for a reduced size of the CSP. One of the basic and novel characteristics of implementations of methods of forming a CSP 26, 96, 168 is the exclusion of a step of coupling any wirebonds to elements of the CSP, which allows for a reduced size of the CSP and fewer failure mechanisms. Another of the basic and novel characteristic of implementations of methods of forming a CSP 26, 96, 168 is the process of mounting the CSP to a motherboard at a ninety degree rotation from a conventional mounting configuration, which allows for a reduced size of the CSP.

In implementations a CSP 26, 96, 168 may be stacked with other CSPs 26, 96, 168. The CSPs 26, 96, 268 may enhance processing by removing the need for thin die handling and the CSPs may also be thermally enhanced (or, in other words, more effective at dissipating heat away from the die) in comparison to the conventional devices. In implementations of CSPs herein that discuss the use of plating the plating may include a tin (Sn) plating and the plating step may be preceded by a copper etch to help the leads receive the Sn plating. In implementations the CSPs 26, 96, 168 may be formed without requiring thin wafer handling and without using any wirebonds, which is useful because conventional package miniaturization is limited by thin wafer handling (about 50-75 microns) and low loop wire bonding. The leads 38, 48, 116, 126, 182, 192, 202 may in implementations be formed, by non-limiting example, from pre-plated frames, clips, lids, clad solder preform or half-etched copper frame.

In implementations one or more of the lead frames 222, 226 may be an LLGA frame with pre-plated leads. One or more or all of the conductive adhesives 14, 34, 36, 88, 110, 112, 114, 176, 178, 180 may include a wafer backside coating (WBC) and in such instances no die attach (DA) adhesive may be required. In implementations the second lead frames 226, 240, 256 may have smaller dimensions than the first lead frames 222, 236, 252, respectively, as can be seen in the figures (and also through the page), and/or may be formed of pre-plated frames, clips, lids, clad solder preform or half-etched copper frame.

In places where the description above refers to particular implementations of chip scale packages and related methods and implementing components, sub-components, methods and sub-methods, it should be readily apparent that a number of modifications may be made without departing from the spirit thereof and that these implementations, implementing components, sub-components, methods and sub-methods may be applied to other chip scale packages and related methods.

What is claimed is:

1. A chip scale package (CSP), comprising:
   a die;
   a first lead mechanically and electrically coupled to a first surface of the die at a first surface of the first lead, the first surface of the first lead forming a first plane and a second surface of the first lead forming a fifth plane, a thickness of the first lead present between the first plane and the fifth plane;
   a second lead mechanically coupled to a second surface of the die at a first surface of the second lead, the first surface of the second lead forming a second plane and a second surface of the second lead forming a fourth plane, a thickness of the second lead present between the second plane and the fourth plane; and
   a mold compound at least partially encapsulating the die, where the die, first lead, second lead, and mold compound form a chip scale package (CSP);
   wherein the first plane of the first lead and the second plane of the second lead are oriented substantially perpendicularly to a third plane formed by a motherboard when the CSP is coupled to the motherboard at the thickness of the first lead and the thickness of the second lead.

2. The CSP of claim 1, wherein the third plane of the motherboard comprises a largest planar surface of the motherboard.

3. The CSP of claim 1, wherein the first plane of the first lead comprises a largest planar surface of the first lead and wherein the second plane of the second lead comprises a largest planar surface of the second lead.

4. The CSP of claim 1, wherein the second surface of the die is on a side of the die opposite the first surface of the die.

5. The CSP of claim 1, wherein the die comprises a first die, and wherein the CSP further comprises a second die mechanically and electrically coupled to the first surface of the second lead at a first surface of the second die, the second die mechanically and electrically coupled to the first die at a second surface of the second die and at the second surface of the first die, wherein the first die is electrically coupled to the second lead only through the second die.

6. The CSP of claim 1, wherein the first lead and the second lead are on opposing surfaces of the CSP.

7. The CSP of claim 1, wherein the CSP comprises no wirebonds.

8. A chip scale package (CSP), comprising:
   a die;
   a first lead mechanically and electrically coupled to a first surface of the die at a planar first surface of the first lead, the first lead comprising a planar second surface on an opposite side of the first lead from the planar first surface of the first lead, the first lead comprising a thickness between the planar first surface of the first lead and the planar second surface of the first lead;
   a second lead mechanically and electrically coupled to a second surface of the die at a planar first surface of the second lead, the second lead comprising a planar second surface on an opposite side of the second lead from the planar first surface of the second lead, the second lead comprising a thickness between the planar first surface of the second lead and the planar second surface of the second lead; and a mold compound at least partially encapsulating the die, where the die, first lead, second lead, and mold compound form a chip scale package (CSP);
wherein the thickness of the first lead and the thickness of the second lead are configured to be coupled to the motherboard when the CSP is coupled to the motherboard.

9. The CSP of claim 8, wherein the thickness of the first lead and the thickness of the second lead are substantially parallel with a largest planar surface of the motherboard.

10. The CSP of claim 8, wherein the CSP comprises no wirebonds.

11. A method of forming a chip scale package (CSP), comprising:
mechanically and electrically coupling a plurality of die to a plurality of first leads of a first lead frame at a first surface of each first lead and at a first surface of each die, the first surface of each first lead forming a first plane and the first lead frame comprising a base;
mechanically and electrically coupling the plurality of die to a plurality of second leads of a second lead frame at a first surface of each second lead and at a second surface of each die, the first surface of each second lead forming a second plane and the second lead frame comprising a base, wherein the second surface of the die is on an opposite side of the die from the first surface of the die;
at least partially encapsulating each die with a mold compound;
removing the base of the first lead frame and the base of the second lead frame, forming a plurality of CSPs; and
singulating the plurality of CSPs, wherein each CSP is configured so that the first plane of each first lead and the second plane of each second lead are substantially perpendicular to a third plane formed by a motherboard when the CSP is coupled to the motherboard.

12. The method of claim 11, wherein the third plane of the motherboard comprises a largest planar surface of the motherboard.

13. The method of claim 11, wherein each die is a first die, and wherein the method further comprises mechanically and electrically coupling a plurality of second die to the plurality of second leads, wherein each second die is mechanically and electrically coupled to one of the second leads at a first surface of the second die and at the first surface of the second lead, the method further comprising mechanically and electrically coupling each second die to one of the first die at a second surface of the second die and at a second surface of the first die, and wherein each first die is electrically coupled to one of the second leads only through one of the second die.

14. The method of claim 11, further comprising mechanically and electrically coupling the plurality of die to a plurality of third leads coupled to the base of the second lead frame, wherein each die is mechanically and electrically coupled to one of the third leads at the second surface of the die and at a fourth plane formed by a first surface of the third lead, the method further comprising orienting the fourth plane of each third lead substantially perpendicularly to the third plane of the motherboard when the CSP is coupled to the motherboard.

15. The method of claim 11, wherein the CSP comprises no wirebonds.

16. A method of forming a chip scale package (CSP), comprising:
mechanically and electrically coupling a plurality of die to a plurality of first leads of a first lead frame, the first lead frame comprising a plurality of partially etched locations, each die being coupled to one of the first leads at a first surface of the die and at a first surface of the first lead, the first surface of each first lead forming a first plane;
mechanically and electrically coupling the plurality of die to a plurality of second leads of a second lead frame, the second lead frame comprising a plurality of partially etched locations, each die being coupled to one of the second leads at a second surface of the die and at a first surface of the second lead, the first surface of each second lead forming a second plane, wherein the second surface of each die is on an opposite side of the die from the first surface of the die;
at least partially encapsulating each die with a mold compound; and
singulating the first lead frame, the mold compound and the second lead frame to form a plurality of chip scale packages (CSPs);
wherein the first plane of each first lead and the second plane of each second lead are oriented substantially perpendicularly to a third plane formed by a motherboard when the CSP is coupled to the motherboard.

17. The method of claim 16, wherein the third plane of the motherboard comprises a largest planar surface of the motherboard.

18. The method of claim 16, wherein each die is a first die, the method further including mechanically and electrically coupling a plurality of second die to the plurality of second leads at a first surface of each second die and at a first surface of each second lead, wherein each second die is mechanically and electrically coupled to one of the first die at a second surface of the first die and a second surface of the second die, and wherein each first die is electrically coupled to one of the second leads only through one of the second die.

19. The method of claim 16, wherein the CSP comprises no wirebonds.

20. A method of forming a chip scale package (CSP) according to claim 1, comprising:
mechanically and electrically coupling the die to the first lead, the first lead comprised in a first lead frame, the first lead frame comprising a plurality of partially etched locations;
mechanically and electrically coupling the die to the second lead, the second lead comprised in a second lead frame and coupled to tie bars of the second lead frame;
mechanically and electrically coupling the die to a third lead at the second surface of the die and at a fourth plane formed by a first surface of the third lead, the third lead comprised in the second lead frame and coupled to the tie bars of the second lead frame;
at least partially encapsulating the die and the second lead frame using the mold compound; and
singulating the first lead frame, the mold compound and the tie bars of the second lead frame to form a chip scale package (CSP) wherein the fourth plane of the third lead is oriented substantially perpendicularly to the third plane formed by the motherboard when the CSP is coupled to a motherboard.

* * * * *